(12) United States Patent
Cherala et al.

(10) Patent No.: US 10,553,501 B2
(45) Date of Patent: Feb. 4, 2020

(54) APPARATUS FOR USE IN FORMING AN ADAPTIVE LAYER AND A METHOD OF USING THE SAME

(71) Applicant: CANON KABUSHIKI KAISHA, Tokyo (JP)

(72) Inventors: Anshuman Cherala, Austin, TX (US); Mario J. Meissl, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/938,958

(22) Filed: Mar. 28, 2018

(65) Prior Publication Data

US 2019/0304850 A1 Oct. 3, 2019

(51) Int. Cl.
*H01L 21/66* (2006.01)
*H01L 21/033* (2006.01)

(52) U.S. Cl.
CPC ......... *H01L 22/12* (2013.01); *H01L 21/0337* (2013.01)

(58) Field of Classification Search
CPC ............................ H01L 22/12; H01L 21/0337
USPC ......................................................... 438/14
See application file for complete search history.

(56) References Cited

U.S. PATENT DOCUMENTS

| | | | | |
|---|---|---|---|---|
| 8,394,282 B2 * | 3/2013 | Panga | ................ | B82Y 10/00 216/38 |
| 8,850,980 B2 * | 10/2014 | Sreenivasan | ........... | B82Y 10/00 101/483 |
| 8,956,789 B2 * | 2/2015 | Raghunathan | ......... | H01L 22/10 378/35 |
| 9,415,418 B2 | 8/2016 | Sreenivasan et al. | | |

OTHER PUBLICATIONS

U.S. Appl. No. 15/162,130, filed May 23, 2016, Specification pp. 1-24, Drawings pp. 1-8.

* cited by examiner

*Primary Examiner* — Vu A Vu
(74) *Attorney, Agent, or Firm* — Abel Schillinger, LLP

(57) ABSTRACT

An apparatus can include a logic element configured to generate information corresponding to an adaptive layer to be formed over a current substrate based at least in part on a difference in flatness profiles associated with a first substrate chuck and a second substrate chuck. In another aspect, a method can include obtaining a difference in thickness profiles for the first and second chucks using a prior substrate, and forming an adaptive layer over a previously formed patterned layer of a current substrate and before forming a patterned resist layer aligned to the previously formed patterned layer. In an embodiment, the thickness profile of the adaptive layer is a function of the inverse of the difference in flatness profiles of the substrate chucks. The adaptive layer can help to reduce overlay error associated with different flatness profiles of substrate chucks.

14 Claims, 9 Drawing Sheets

APPARATUS FOR USE IN FORMING AN ADAPTIVE LAYER AND A METHOD OF USING THE SAME

FIELD OF THE DISCLOSURE

The present disclosure relates to apparatuses, and more particularly to apparatuses used in forming adaptive layers.

RELATED ART

Lithographic apparatuses and processes are useful in forming nanoscale patterns on semiconductor substrates in the fabrication of electronic devices. Such apparatuses and processes can include the use of fluid dispense systems for depositing a formable material, for example, a polymerizable material, such as a resin or a resist, onto the substrate, using techniques such as fluid droplet dispense. The dispensed material is contacted with an imprint template (or mold) having desired pattern features and then solidified, forming a patterned layer on the substrate. Template feature fill rates and related defects are dependent, in part, on template pattern feature density and orientation and the droplet pattern arrangement, including the fluid droplet pitch.

When forming a patterned resist layer at a current level, the patterned resist layer needs to be overlaid properly with respect to a prior patterned layer. The prior patterned layer may have been formed using optical lithography, imprint lithography, or another patterning technique. Any deviation between the layers is referred to as an overlay error. Even very small deviations with any part of a lithographic apparatus can result in significant overlay error due to the very small dimensions of features formed at the current and prior patterning levels.

SUMMARY

In an aspect, an apparatus comprises a logic element configured to generate information corresponding to an adaptive layer to be formed over a current substrate based at least in part on a difference in flatness profiles associated with a first substrate chuck and a second substrate chuck.

In an embodiment, the difference in flatness profiles is based at least in part on a raw overlay error between a first patterned layer and a second patterned layer over a prior substrate, wherein the first patterned layer was patterned using the first substrate chuck, and the second patterned layer was pattered using the second substrate chuck.

In a particular embodiment, the logic element is further configured to remove an alignment contribution that corresponds to a misalignment between the first and second patterned layers.

In another particular embodiment, the logic element is further configured to remove an imprint distortion contribution that corresponds to an imprint distortion associated with a first imprint template used to form the first patterned layer, a second imprint template used to form the second patterned layer, or the first and second imprint templates.

In still another particular embodiment, the logic element is further configured to remove a mean field signature.

In a further particular embodiment, the logic element is further configured to remove a flatness induced distortion contribution associated with the first and second substrate chucks.

In another embodiment, the logic element is further configured to: measure a raw overlay error between a first patterned layer and a second patterned layer over a prior substrate, wherein the first patterned layer was patterned using the first substrate chuck, and the second patterned layer was pattered using the second substrate chuck; remove an alignment contribution corresponds to a misalignment between the first and second patterned layers; remove an imprint distortion contribution that corresponds to an imprint distortion associated with a first imprint template used to form the first patterned layer, a second imprint template used to form the second patterned layer, or the first and second imprint templates; and remove a flatness induced distortion contribution associated with the second substrate chuck.

In a particular embodiment, the logic element is further configured to: remove a mean field signature.

In a further embodiment, the information corresponding to an adaptive layer includes a fluid droplet pattern associated with the adaptive layer.

In another aspect, a method comprises determining a difference in flatness profiles associated with a first substrate chuck and a second substrate chuck; and forming an adaptive layer over a current substrate, wherein the adaptive layer has a thickness profile that is a function of an inverse of the difference in the flatness profiles.

In an embodiment, determining the difference in flatness profiles comprises measuring a raw overlay error between a first patterned layer and a second patterned layer over a prior substrate, wherein the first patterned layer was patterned using the first substrate chuck, and the second patterned layer was pattered using the second substrate chuck.

In a particular embodiment, determining the difference in flatness profiles further comprises removing an alignment contribution that corresponds to a misalignment between the first and second patterned layers.

In another particular embodiment, determining the difference in flatness profiles further comprises removing an imprint distortion contribution that corresponds to an imprint distortion associated with a first imprint template used to form the first patterned layer, a second imprint template used to form the second patterned layer, or the first and second imprint templates.

In a further particular embodiment, determining the difference in flatness profiles further comprises removing a mean field signature.

In a more particular embodiment, determining the difference in flatness profiles further comprising determining the mean field signature associated with a first imprint template used to form the first patterned layer, a second imprint template used to form the second patterned layer, or the first and second imprint templates.

In another particular embodiment, determining the difference in flatness profiles further comprises removing a flatness induced distortion contribution associated with the first and second substrate chucks.

In a more particular embodiment, the method further comprises estimating a distortion due to differences in flatness profiles of the first and second substrate chucks, wherein the estimated distortion corresponds to the flatness induced distortion contribution.

In another embodiment, determining the difference in flatness profiles comprises: measuring a raw overlay error between a first patterned layer and a second patterned layer over a prior substrate, wherein the first patterned layer was patterned using the first substrate chuck, and the second patterned layer was pattered using the second substrate chuck; removing an alignment contribution that corresponds to a misalignment between the first and second patterned layers; removing an imprint distortion contribution that corresponds to an imprint distortion associated with a first imprint template used to form the first patterned layer, a second imprint template used to form the second patterned layer, or the first and second imprint templates; and estimating a distortion due to differences in flatness profiles of the first and second substrate chucks.

In a particular embodiment, determining the difference in flatness profiles further comprises removing a mean field signature.

In a further embodiment, the method further comprises forming a formable material over the adaptive layer and the current substrate; contacting the formable material with an imprint template; and curing the formable layer to form a patterned resist layer.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

Embodiments as described herein can be useful in reducing the effect of differences in flatness profiles between different substrate chucks with respect to overlay error. Data regarding the difference in flatness profiles of two substrate chucks can be used to determine a thickness profile for an adaptive layer. In an embodiment, a prior substrate can have two different patterned layers, in which one of the patterned layers is aligned to the other, and the patterned layers are processed on different substrate chucks. Raw overlay error can be determined, and various contributors to the raw overlay error can be removed until, the difference in flatness profiles is determined. An adaptive layer can be formed on a current substrate after a patterned layer is formed and before a patterned resist layer, which is to be aligned to the underlying patterned layer, is formed. The adaptive layer can have a thickness profile that is a function of the inverse of the difference in flatness profiles of the substrate chucks. The adaptive layer can help to counteract the effects due to the differences in flatness profiles of the substrate chucks. Accordingly, a patterned resist layer can be formed and aligned to a previously formed patterned layer with less overlay error.

Details regarding the apparatus and method are better understood after reading this specification in conjunction with figures. The description below is meant to illustrate embodiments and not limit the scope of the present invention, which is defined in the appended claims.

Figure 1:
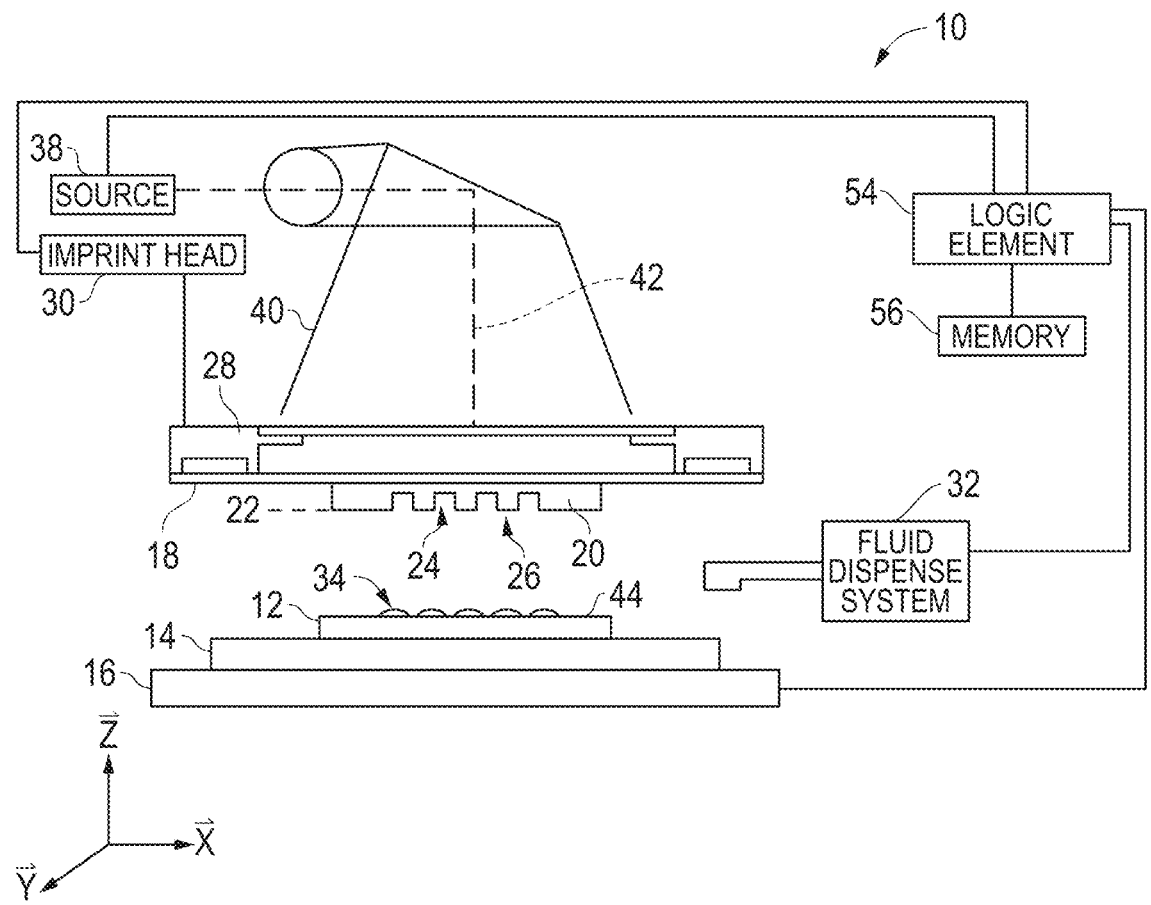
FIG. 1 includes an illustration of a side view of an exemplary apparatus.

Referring to FIG. 1, an apparatus 10 in accordance with an embodiment described herein can be used to form a relief pattern on a substrate 12. The substrate 12 may be coupled to a substrate chuck 14. As illustrated, the substrate chuck 14 is a vacuum chuck; however, in other embodiments the substrate chuck 14 may be any chuck including vacuum, pin-type, groove-type, electrostatic, electromagnetic, or the like. The substrate 12 and substrate chuck 14 may be further supported by a stage 16. The stage 16 may provide translating or rotational motion along the X-, Y-, or Z-directions. The stage 16, substrate 12, and substrate chuck 14 may also be positioned on a base (not illustrated).

Spaced-apart from the substrate 12 is a template 18. The template 18 can include a body having a first side and a second side with one side having a mold 20 extending therefrom towards the substrate 12. The mold 20 is sometimes referred to as a mesa. In an embodiment, the template 18 can be formed without a mold 20.

The template 18, mold 20, or both may be formed from such materials including fused-silica, quartz, silicon, organic polymers, siloxane polymers, borosilicate glass, fluorocarbon polymers, metal, hardened sapphire, other similar materials, or any combination thereof. The template 18 and mold 20 can include a single piece construction. Alternatively, the template 18 and mold 20 can include separate components coupled together. As illustrated, an imprint surface 22 of the mold 20 includes features defined by spaced-apart recesses 24 and protrusions 26. The imprint surface 22 may define any original pattern that forms the basis of a pattern to be formed on the substrate 12. In another embodiment, the imprint surface 22 can be a blank, that is, the imprint surface 22 does not have any recesses or protrusions.

The template 18 can be coupled to a chuck 28. The chuck 28 can be configured as vacuum, pin-type, groove-type, electrostatic, electromagnetic, or another similar chuck type. In an embodiment, the chuck 28 may be coupled to a head 30 such that the chuck 28 or head 30 can facilitate movement of the template 18.

The apparatus 10 can further include a fluid dispense system 32 used to deposit a formable material 34 on the substrate 12. For example, the formable material 34 can include a polymerizable material, such as a resin. The formable material 34 can be positioned on the substrate 12 in one or more layers using techniques such as droplet dispense, spin-coating, dip coating, chemical vapor deposition (CVD), physical vapor deposition (PVD), thin film deposition, thick film deposition, or combinations thereof. The formable material 34 can be dispensed upon the substrate 12 before or after a desired volume is defined between the mold 20 and the substrate 12, depending on design considerations. For example, the formable material 34 can include a monomer mixture that can be cured using ultraviolet light, heat, or the like.

The apparatus 10 can further include an energy source 38 coupled to a direct energy 40 along a path 42. The head 30 and stage 16 can be configured to position the template 18 and substrate 12 in superimposition with the path 42. The apparatus 10 can be regulated by a logic element 54 in communication with the stage 16, head 30, fluid dispense system 32, or source 38, and may operate on a computer readable program, optionally stored in memory 56. The logic element 54 may be a processor (for example, a central processing unit of a microprocessor or microcontroller), a field-programmable gate array (FPGA), an application specific integrated circuit (ASIC), or the like. The processor, FPGA, or ASIC can be within the apparatus. In another embodiment (not illustrated), the logic element can be a computer external to the apparatus 10 and is bidirectionally coupled to the apparatus 10.

In a particular aspect, the logic element 54 can be configured to execute or provide instructions for another component of the apparatus 10 to execute one or more operations of the methods described herein. For example, the logic element 54 may be configured to execute one or more logic operations to generate information corresponding to an adaptive layer to be formed over a current substrate based at least in part on a difference in flatness profiles associated with a first substrate chuck and a second substrate chuck. The difference in flatness profiles can be based at least in part on a raw overlay error between a first patterned layer and a second patterned layer over a prior substrate, wherein the first patterned layer was patterned using the first substrate chuck, and the second patterned layer was pattered using the second substrate chuck.

The logic element 54 can be configured to execute one or more logic operations to measure a raw overlay error between a first patterned layer and a second patterned layer over a prior substrate, wherein the first patterned layer was patterned using the first substrate chuck, and the second patterned layer was pattered using the second substrate chuck. The first patterned layer may have been formed using any suitable lithographic patterning technique, such as optical lithography or imprint lithography. Alternatively, such overlay error information may be provided by a metrology tool.

In another aspect, the logic element 54 can be configured to execute one or more logic operations to remove an alignment contribution that corresponds to a misalignment between the first and second patterned layers. Further, the logic element 54 can be further configured to execute one or more logic operations to remove an imprint distortion contribution that corresponds to the imprint distortion associated with a first imprint template used to form the first patterned layer, a second imprint template used to form the second patterned layer, or the first and second imprint templates. In still another aspect, the logic element 54 can be further configured to execute one or more logic operations to remove a mean field signature and to estimate distortions due to differences in flatness profiles of substrate chucks.

More details with respect to the methods of generating information in order to form an adaptive layer with the proper thickness are described later in this specification. The description in the next few paragraphs addresses the apparatus 10 and its use in forming a patterned layer using an imprint lithographic technique.

Figure 2:
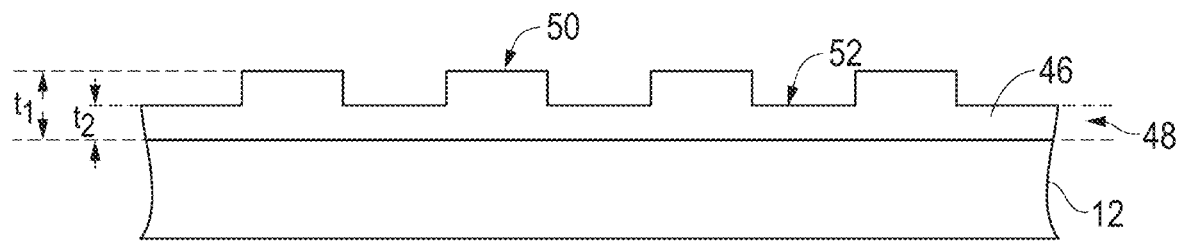
FIG. 2 includes an illustration of a cross-sectional view of the substrate illustrated in FIG. 1 after forming a patterned layer.

Referring to FIGS. 1 and 2, in an embodiment, either the head 30, the stage 16, or both the head 30 and the stage 16, vary a distance between the mold 20 and the substrate 12 to define a desired volume therebetween that is filled by the formable material 34. For example, the head 30 can apply a force to the template 18, such that the mold 20 contacts the formable material 34 on the substrate 12. After the desired volume is filled with the formable material 34, the source 38 can produce energy 40, e.g., ultraviolet radiation, causing the formable material 34 to solidify or cross-link to define a patterned layer 46 on the substrate 12. The patterned layer 46 has a lower surface conforming to a shape of the surface 44 of the substrate 12 and an upper surface conforming to a shape of the imprint surface 22. As illustrated in FIG. 2, the patterned layer 46 can include features, illustrated as protrusions 50 and recessions 52, with the protrusions 50 having a thickness, $t_1$ and the recessions 52 correspond to a residual layer 48 having a thickness $t_2$, which is the residual layer thickness (RLT).

When using a droplet dispense method for the formable material 34, the imprint operation generally includes (1) moving the substrate 12 and fluid dispense ports of the fluid dispense system 32 relative to each other, (2) dispensing (or depositing) fluid droplets of the formable material 34 on a surface of the substrate 12 with a fluid droplet pattern, (3) bringing the imprint surface 22 of the template 18 into contact with the fluid droplets such that the fluid spreads and fills the topography of the imprint surface 22, (4) solidifying (e.g., photocuring or thermally curing) the formable material 34, and (5) separating the template 18 from the substrate 12, leaving the patterned layer 46 of formable material 34 on the substrate surface, wherein the patterned layer 46 has a relief image of the imprint pattern 22.

While the formation of the patterned layer 46 is relatively simple on a conceptual basis, the patterned layer 46 is significantly difficult to form, particularly in view of the small dimensions, avoiding direct contact between the template 18 and the substrate 12, and desire for high throughput for the apparatus 10. The formation of the patterned layer 46 is even further more difficult when it needs to be aligned to a previously formed patterned layer. In theory, a substrate chuck should be perfectly flat. In practice, small deviations may occur and contribute to overlay error. For example, isolated or relatively narrow features, such as pins, of a substrate chuck may lie at a slightly lower elevation, as compared to more densely packed or relatively wider features, such as lands, due to dishing or other effects during polishing or etching of the substrate chuck. Further, no two substrate chucks are completely identical, so some difference in the flatness profiles between different substrate chucks will occur. An adaptive layer can be formed to counteract the difference in flatness profiles between different substrate chucks.

Between two substrate chucks, there will be differences even though the fabrication technique may be the same. For example, upper surfaces of lands and a structure may be polished with different polishing pads. Even when the same polishing pad is used, the polishing pad may be more worn when polishing the second substrate chuck as compared to the first substrate chuck. A polishing slurry, downforce pressure, rotational motion, orbital motion, or any combination thereof between the polishing tool and the substrate chucks will be very similar but not identical. These differences can contribute to the overlay error. As will be discussed below, the differences in flatness profiles between substrate chucks can be determined, and an adaptive layer can be formed to counteract the difference.

In general, overlay error for a particular substrate can be affected by many variables. A first substrate chuck can be used to print a layer 0 pattern, and a second substrate chuck can be used to print a layer 1 pattern. Overall, the substrate 12, apparatus 10, and the process can contribute to overlay error between two patterned layers on a prior substrate. In a non-limiting embodiment, the patterned layers may be a field isolation layer and a gate layer, a gate layer and a contact layer, or another combination of layers. In an embodiment, the gate layer may be aligned to the field isolation layer, and the contact layer may be aligned to the gate layer or the field isolation layer. Raw overlay error data can be determined, and thereafter, known contributors to the raw overlay error data can be removed from the raw overlay error data, so that only differences in flatness profiles of the substrate chucks remain.

A current substrate may have one of the patterned layers formed using optical or imprint lithography, and a patterned resist layer is to be formed over the patterned layer. Before forming the resist layer, an adaptive layer is formed. The adaptive layer has a thickness profile that is a function of the inverse of the difference in the flatness profiles. The resist layer is formed over the adaptive layer.

More details regarding methods for determining differences in flatness profiles between different substrate chucks are described before addressing details with respect to manufacturing an article using the adaptive layer generated from the information obtained from determining differences in flatness profiles between different substrate chucks.

Figure 3:
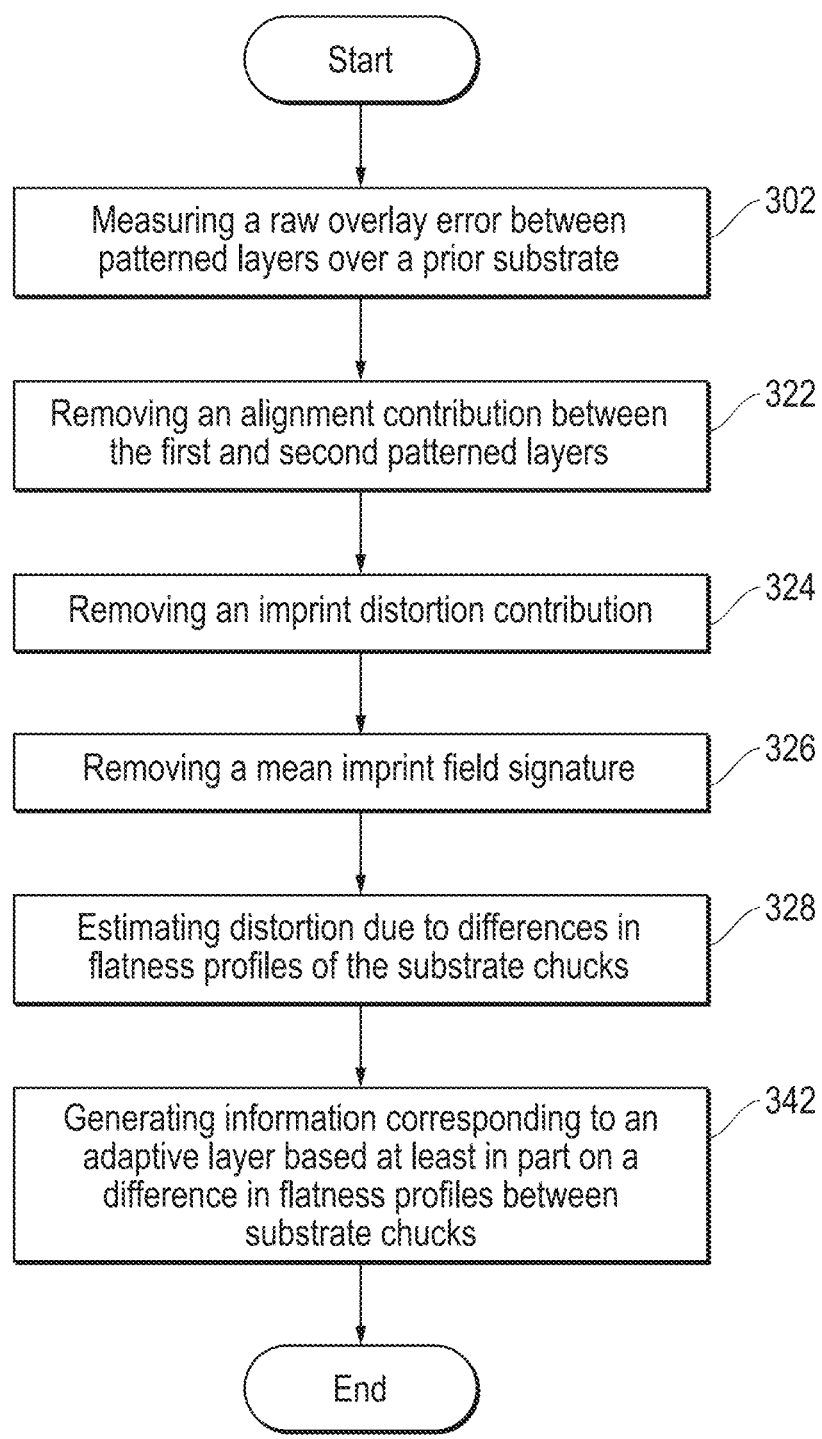
FIG. 3 includes a flow chart to determine a thickness profile for an adaptive layer when starting from raw overlay error between two patterned layers formed using different substrate chucks.

FIG. 3 includes the process flow for a method of obtaining the differences in flatness profiles of the substrate chucks that may be used during the formation of nanoscale patterns on semiconductor substrates. The information generated using the method as described with respect to FIG. 3 can be obtained from two different layers that are imprinted on the same substrate using two different substrate chucks. Commencing at block 302, the method can include measuring raw overlay error data between patterned layers over a prior substrate. In a particular aspect, the raw overlay error data can include the amount of in-plane error within the various print fields of the substrate. The raw overlay error data can also include an alignment contribution, a distortion contribution, field mean signature contribution, flatness induced distortion contribution, other contributions to raw overlay error, or a combination thereof.

Figure 4:
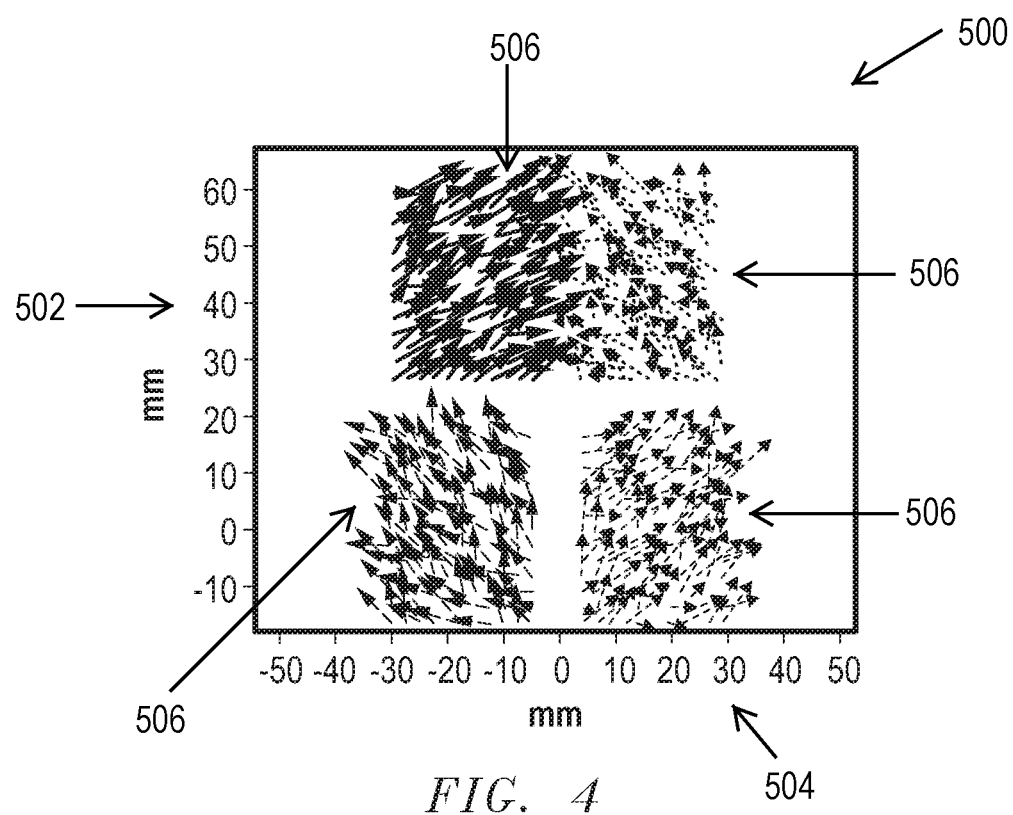
FIG. 4 includes an illustration of a plot representing raw overlay error between two different patterned layers on a prior substrate.

FIG. 4 depicts an illustration of a plot 500 that represents raw overlay error data between two different patterned layers on a prior substrate. The plot 500 illustrated in FIG. 4 includes an ordinate 502 and an abscissa 504 and individual fields 506 plotted relative to the ordinate 502 and abscissa 504. Each field 506 within the plot 500 represents a field on the prior substrate and includes an amount of in-plane error within the individual fields of the substrate. FIG. 4 includes four fields. A substrate can have more fields, such as near or over 100 fields. After reading this specification, skilled artisans can use the teachings herein for an entire substrate. In a particular aspect, the amount of in-plane error within each field can be plotted as error measured at overlay metrology marks 510. A non-limiting example of overlay metrology marks can include KLA Archer marks.

Figure 5:
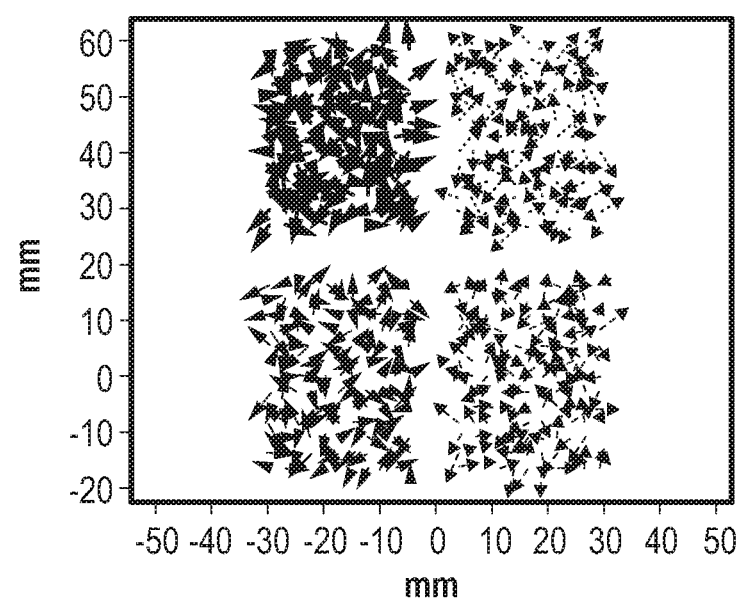
FIG. 5 includes an illustration of the plot of FIG. 4 after removing alignment and distortion contributions to the raw overlay error.

Returning to FIG. 3, at block 322, the method can include removing an alignment contribution that corresponds to a misalignment between the first and second patterned layers from the raw overlay error. The alignment contribution to the overlay error data can be based on alignment distortion data between two patterned layers, e.g., the first patterned layer and the second patterned layer (i.e., layer 0 and layer 1). In a particular embodiment, the second patterned layer is to be aligned to the first patterned layer. Moreover, at block 324, the method can include removing a distortion contribution from the raw overlay error. The distortions are largely due to the physical nature of the process. FIG. 5 includes an illustration of the plot 500 introduced in FIG. 4, but with the alignment and distortion contributions removed.

Figure 6:
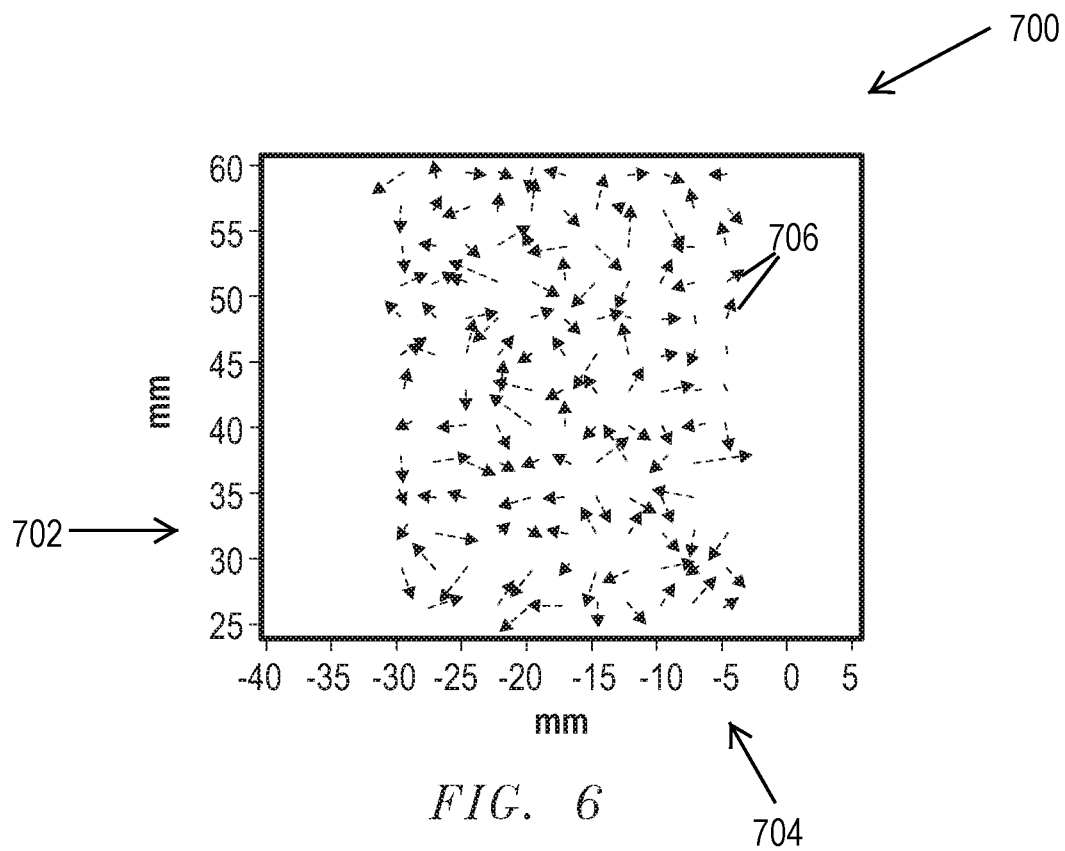
FIG. 6 includes an illustration of a plot of a field mean signature.

Returning to the description of the method, at block 326, the method can include removing a mean field signature from the raw overlay error data. In a particular aspect, this operation of the method can be optional. The field mean signature corresponds to repetitive errors that are averaged over all of the fields. FIG. 6 includes an illustration of a field mean signature plot 700. The field mean signature plot 700 includes an ordinate 702 and an abscissa 704. The field mean signature plot 700 includes a plurality of overlay metrology marks 706 that represent errors that repeat in all of the fields of the substrate.

Figure 7:
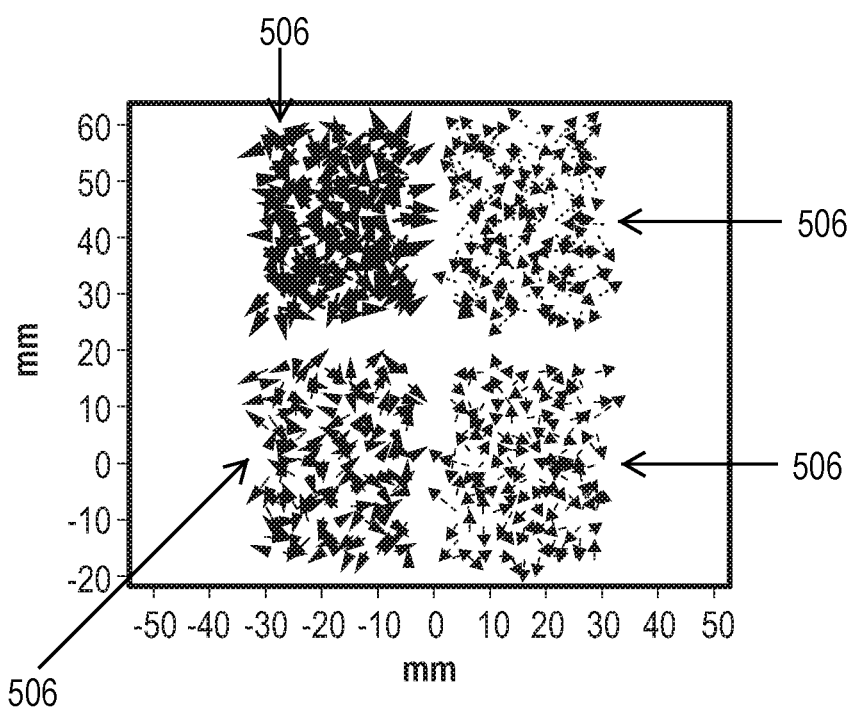
FIG. 7 includes an illustration of the plot of FIG. 5 after removing the field mean signature contribution.

FIG. 7 includes another illustration of the plot 500 introduced in FIG. 4 and updated in FIG. 5, but with the field mean signature removed from each imprint field 506 of the plot 500 in addition to the previously removed alignment and distortion contributions (as illustrated in FIG. 5).

Figure 8:
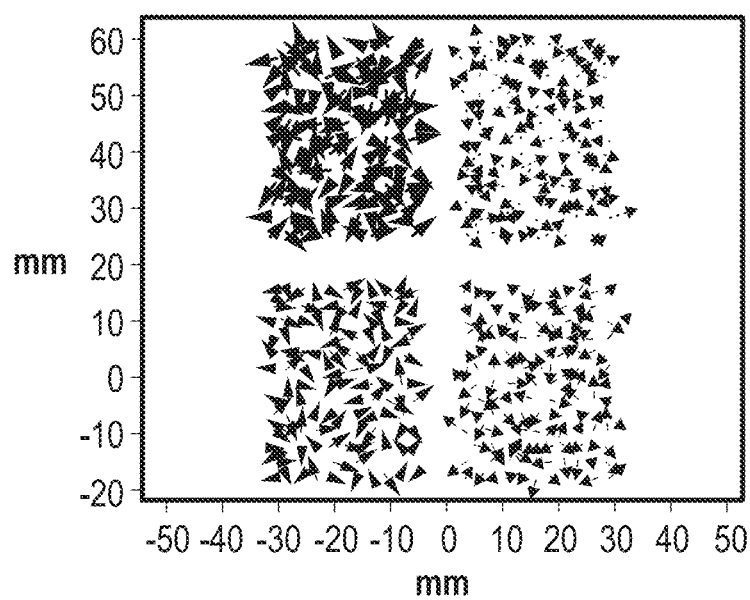
FIG. 8 includes an illustration of the estimated distortion due to flatness profile differences in the plot of FIG. 7.

At block 328 of FIG. 3, the method can include estimating distortion due to differences in flatness profiles in wafer chucks from the raw overlay error data. FIG. 8 is another illustration of the plot 500, introduced in FIG. 4 and updated in FIG. 5 and FIG. 7, showing the estimated distortions induced due to differences in flatness profiles between wafer chucks. Thus, FIG. 8 includes information corresponding to the difference in flatness profiles between substrate chucks.

Figure 9:
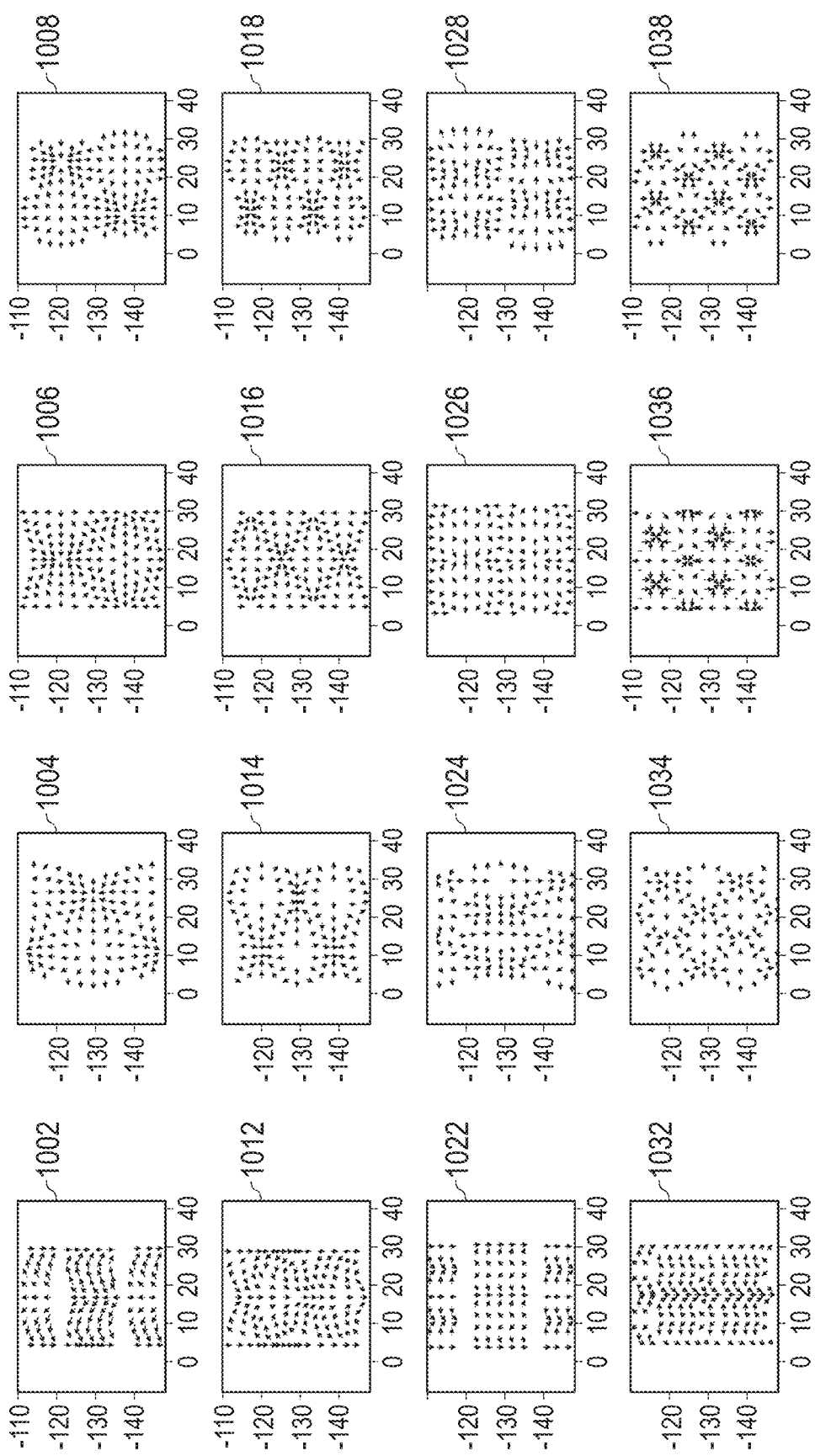
FIGS. 9 and 10 include illustrations of exemplary differences in flatness profiles and the corresponding in-plane distortions induced due to the flatness profiles.

At block 342 of FIG. 3, the method can include generating information corresponding to an adaptive layer at least in part on a difference in flatness profiles between substrate chucks. FIG. 9 includes sixteen exemplary in-plane distortion plots 1002, 1004, 1006, 1008, 1012, 1014, 1016, 1018, 1022, 1024, 1026, 1028, 1032, 1034, 1036, and 1038 having various exemplary surface patterns. These sixteen exemplary overlay metrology mark plots 1002, 1004, 1006, 1008, 1012, 1014, 1016, 1018, 1022, 1024, 1026, 1028, 1032, 1034, 1036, and 1038 are predetermined and are used to model potential surface topographies that may be present on a particular substrate chuck.

Figure 10:
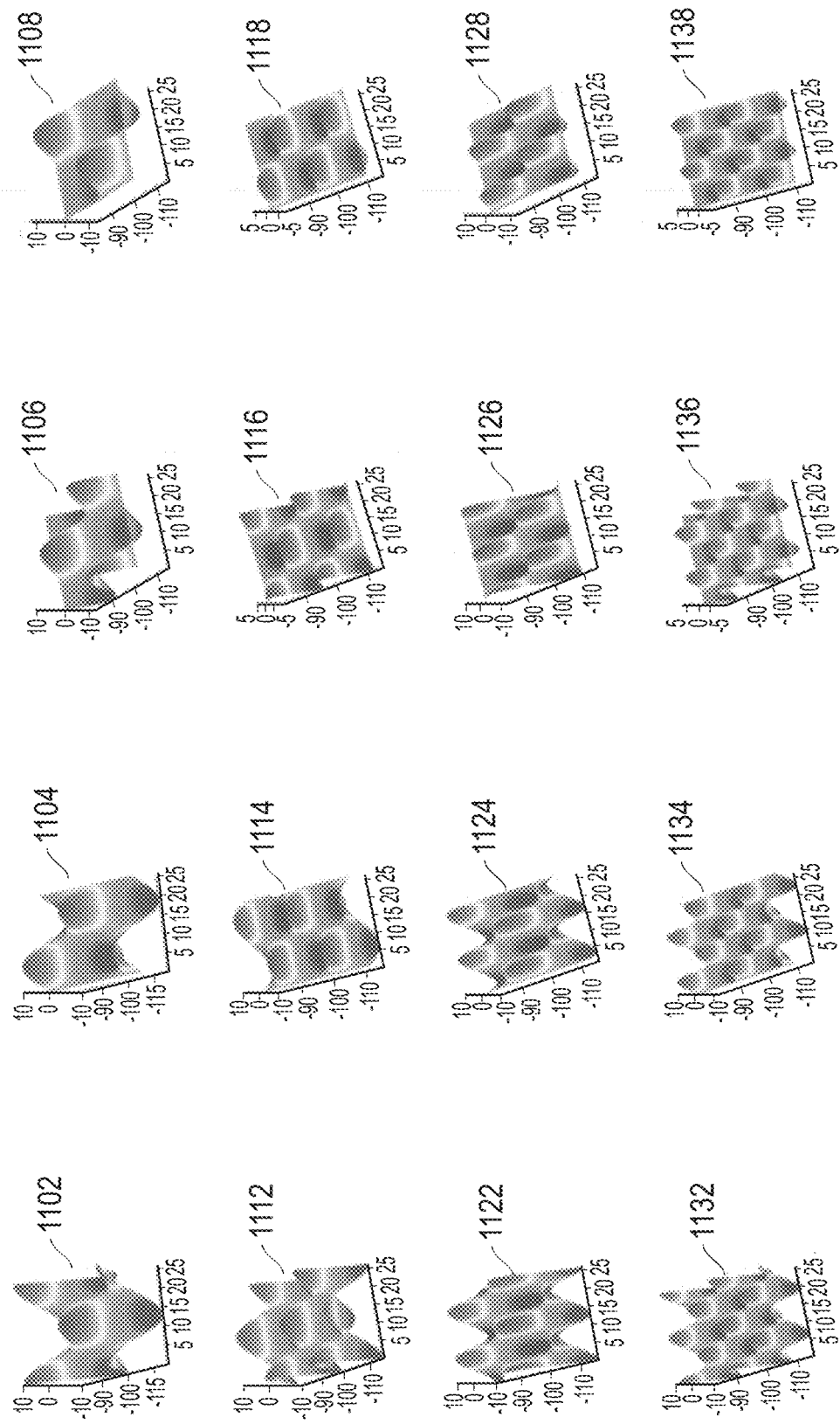

FIG. 10 includes sixteen three-dimensional (3-D) models 1102, 1104, 1106, 1108, 1112, 1114, 1116, 1118, 1122, 1124, 1126, 1128, 1132, 1134, 1136, and 1138 that correspond to the patterns in the exemplary distortion plots 1002, 1004, 1006, 1008, 1012, 1014, 1016, 1018, 1022, 1024, 1026, 1028, 1032, 1034, 1036, and 1038 of FIG. 9. From the 3-D models 1102, 1104, 1106, 1108, 1112, 1114, 1116, 1118,

1122, 1124, 1126, 1128, 1132, 1134, 1136, and 1138 illustrated in FIG. 10, the difference in flatness profiles of surface of different substrate chucks can be described, or otherwise modeled, with a mathematical function. The fundamental plate equation that connects in-plane distortion and plate bending shape is given by:

$$\Delta x = \frac{t}{2}\frac{\partial z}{\partial x}; \Delta y = \frac{t}{2}\frac{\partial z}{\partial y} \quad (1)$$

where,
Δx=the distortion in X direction due to plate bending
Δy=the distortion in Y direction due to plate bending
z=z(x,y) the change in shape of the plate, due to bending
t=effective thickness of plate(s)

The equation above is derived for thin plates with small deformations which suits the situation well.

The estimated differences in flatness for the substrate chucks, can be modeled as described above, from the in-plane distortion data. By modeling the chuck flatness and an inverse thereof, a lithographic apparatus, e.g., the apparatus 10 described above in conjunction with FIG. 1, can use this data to generate an adaptive layer for a substrate.

The information above was obtained from a prior substrate. This information can be used in processing a current substrate, including formation of an adaptive layer to account for differences in the flatness profiles between the substrate chucks. In an embodiment, the current substrate will be processed with the same substrate chucks. The same layers used for the prior substrate or different layers can be used. For example, the prior substrate was processed at layer 0 on substrate chuck 0 and processed at layer 1 on substrate chuck 1. Thus, the current substrate is processed at layer 0 on substrate chuck 0 and processed at layer 1 on substrate chuck 1. In another embodiment, the current substrate is processed at layer 1 on substrate chuck 0 and processed at layer 2 on substrate chuck 1. Layer 1 may be aligned to layer 0, and layer 2 may be aligned to layer 1.

Figure 11:
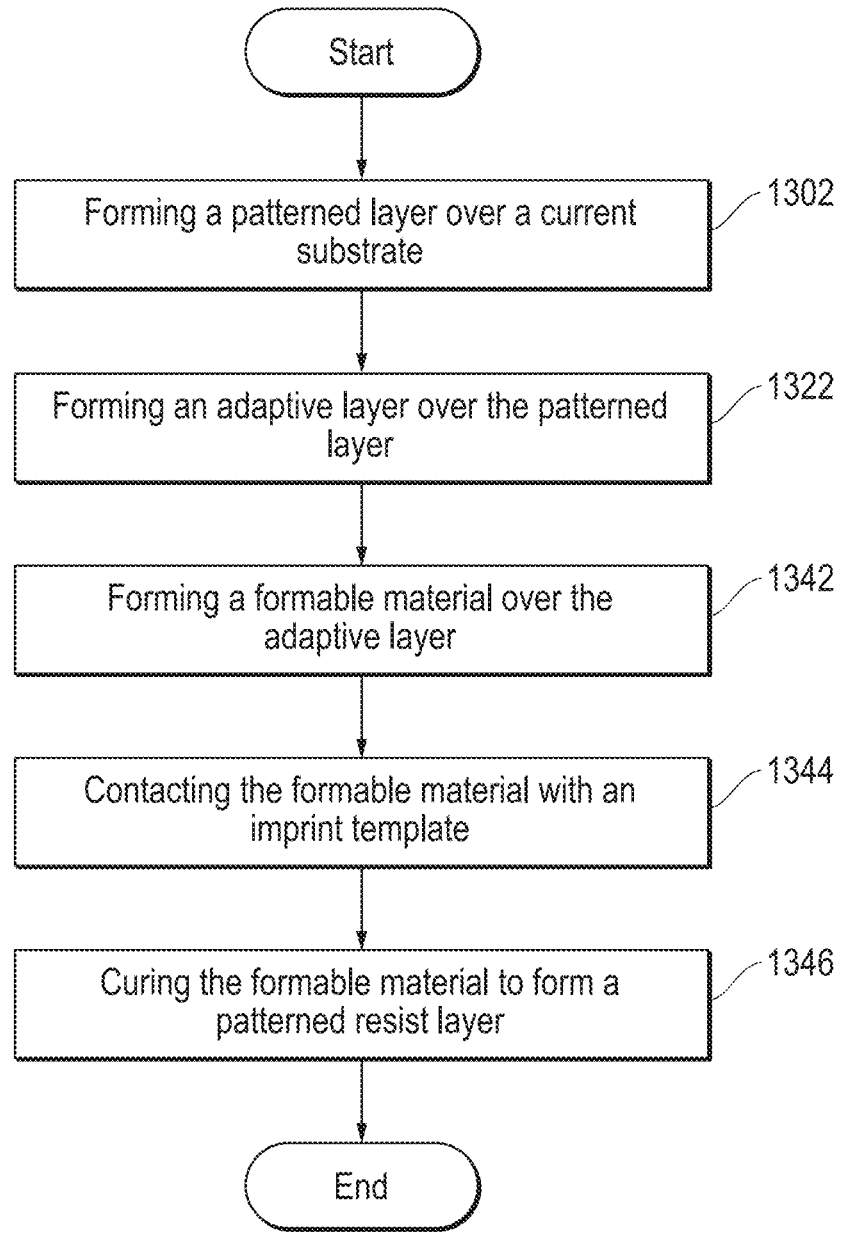
FIG. 11 includes a flow chart for forming an adaptive layer and a patterned resist layer over a current substrate.

Referring now to FIG. 11, at block 1302, the method can include forming a patterned layer over a current substrate. The patterned layer can be formed before the adaptive layer is formed. Referring to the example above, the patterned layer of the current substrate may be layer 0 processed using substrate chuck 0. At block 1322, the method can include forming an adaptive layer over the patterned layer. The adaptive layer can have a thickness that is a function of the inverse of the differences in flatness of the substrate chucks, as describe herein. Returning to the example, the adaptive layer would have a thickness profile that is a function of the inverse of the difference in flatness profiles between substrate chucks 0 and 1.

At this point in time, processing can be continued to form layer 1 over the adaptive layer and the current substrate, where imprinting will be performed using substrate chuck 1. At block 1342, the method can include forming a formable layer over the adaptive layer. Thereafter, at block 1344, the method can include contacting the formable material with an imprint template. The adaptive layer compensates for the difference in flatness profiles of the substrate chucks 0 and 1 and reduces their corresponding contribution to overlay error. Finally, at block 1346, the method can include curing the formable material to form a patterned resist layer. In the example, the patterned resist layer is layer 1.

Figure 12:
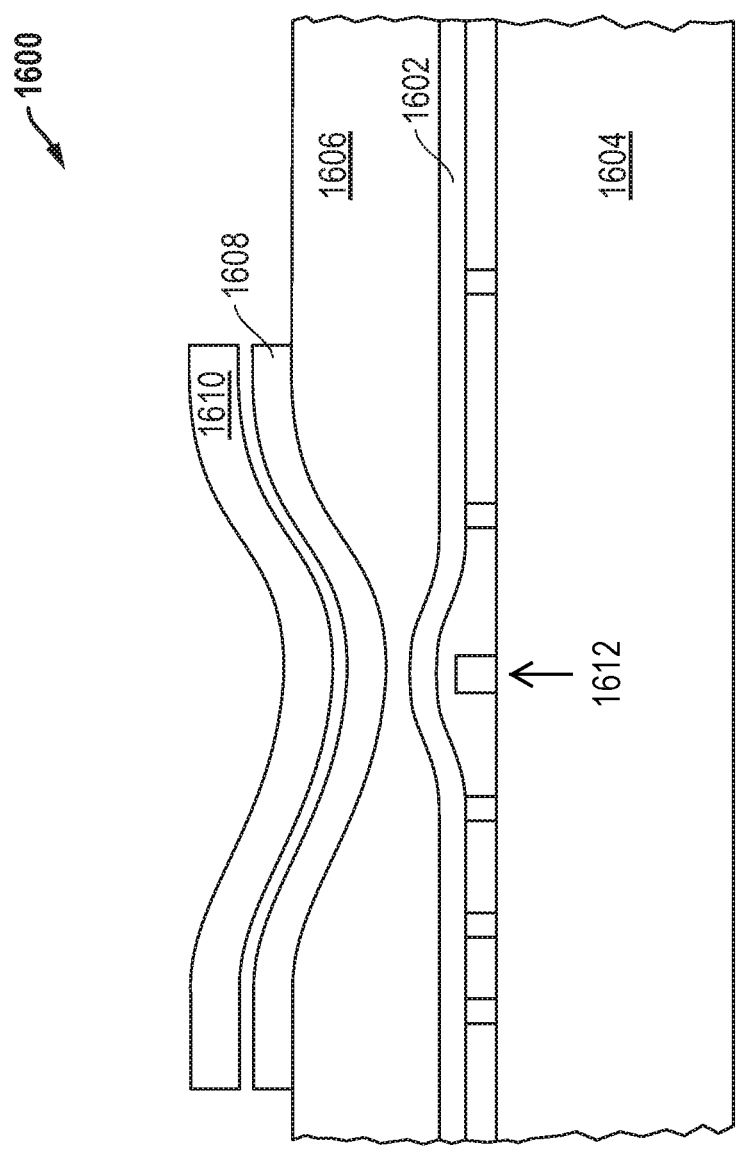
FIG. 12 includes an illustration of a cross-sectional view of portions of a substrate chuck, a current substrate, the adaptive layer, the patterned resist layer, and a template.

FIG. 12 includes a cross-sectional view of a portion on an apparatus 1600 during the imprint operation. As illustrated, a substrate 1602 is supported by a substrate chuck 1604 of the apparatus 1600. The substrate 1602 includes a patterned layer, although the layer is not separately illustrated in FIG. 12. In this example, the patterned layer on substrate 1602 is layer 0. An adaptive layer 1606 can be formed, or otherwise disposed, over the patterned layer of the substrate 1602. Thereafter, a formable material is formed over the adaptive layer 1606. A mask 1610 is used to imprint the formable material that is cured to form a resist layer 1608. In this manner, the mask forms layer 1 atop adaptive layer 1606. The substrate chuck 1604, used to form layer 1, has a local flatness error at position 1612, causing local in-plane distortion of layer 0, which leads to overlay error between layer 0 and 1. The shape of adaptive layer 1606, which is an inverse function of the chuck flatness profile, attenuates the overlay error.

Embodiments as described herein can be useful in reducing the effect of differences in flatness profiles between different substrate chucks on overlay error. The adaptive layer can help to counteract the effects due to the differences in flatness profiles. Accordingly, a patterned resist layer can be formed and aligned to a previously formed patterned layer with less overlay error.

Note that not all of the activities described above in the general description or the examples are required, that a portion of a specific activity may not be required, and that one or more further activities may be performed in addition to those described. Still further, the order in which activities are listed is not necessarily the order in which they are performed. Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An apparatus comprising:
   a logic element, wherein the logic element
      obtains a raw overlay error between a first patterned layer and a second patterned layer over a first substrate, wherein the first patterned layer was patterned using a first substrate chuck, and the second patterned layer was patterned using a second substrate chuck;

determines a difference in flatness profiles associated with the first substrate chuck and the second substrate chuck, wherein the difference in flatness profiles is based at least in part on the raw overlay error between the first patterned layer and the second patterned layer;

generates information corresponding to an adaptive layer to be formed over a second substrate in response to the difference in flatness profiles associated with the first substrate chuck and the second substrate chuck; and removes an imprint distortion contribution that corresponds to an imprint distortion associated with the difference in the flatness profiles in a first imprint template used to form the first patterned layer, a second imprint template used to form the second patterned layer, or the first and second imprint templates.

2. The apparatus of claim 1, wherein the logic element is further configured to remove an alignment contribution that corresponds to a misalignment between the first and second patterned layers.

3. The apparatus of claim 1, wherein the logic element is further configured to remove a mean field signature, wherein the mean field signature corresponds to repetitive errors that are averaged over all fields.

4. The apparatus of claim 1, wherein the logic element is further configured to remove a flatness induced distortion contribution associated with the first and second substrate chucks.

5. The apparatus of claim 1, wherein the information corresponding to an adaptive layer includes a fluid droplet pattern associated with the adaptive layer.

6. An apparatus comprising a logic element configured to:
obtain a raw overlay error between a first patterned layer and a second patterned layer over a first substrate, wherein the first patterned layer was patterned using a first substrate chuck, and the second patterned layer was patterned using a second substrate chuck;

generate information corresponding to an adaptive layer to be formed over a second substrate based at least in part on a difference in flatness profiles associated with a first substrate chuck and the second substrate chuck;

remove an alignment contribution corresponds to a misalignment between the first and second patterned layers;

remove an imprint distortion contribution that corresponds to an imprint distortion associated with the difference in the flatness profiles in a first imprint template used to form the first patterned layer, a second imprint template used to form the second patterned layer, or the first and second imprint templates; and remove a flatness induced distortion contribution associated with the second substrate chuck.

7. The apparatus of claim 6, wherein the logic element is further configured to:
remove a mean field signature, wherein the mean field signature corresponds to repetitive errors that are averaged over all fields.

8. A method, comprising:
determining a difference in flatness profiles associated with a first substrate chuck and a second substrate chuck; and forming an adaptive layer over a first substrate, wherein the adaptive layer has a thickness profile that is a function of an inverse of the difference in the flatness profiles, and wherein determining the difference in flatness profiles comprises:
measuring a raw overlay error between a first patterned layer and a second patterned layer over a second substrate, wherein the first patterned layer was patterned using the first substrate chuck, and the second patterned layer was patterned using the second substrate chuck;

removing an alignment contribution that corresponds to a misalignment between the first and second patterned layers;

removing an imprint distortion contribution that corresponds to an imprint distortion associated with a first imprint template used to form the first patterned layer, a second imprint template used to form the second patterned layer, or the first and second imprint templates; and estimating a distortion due to differences in flatness profiles of the first and second substrate chucks.

9. The method of claim 8, wherein determining the difference in flatness profiles further comprises removing a mean field signature, wherein the mean field signature corresponds to repetitive errors that are averaged over all fields.

10. The method of claim 9, wherein determining the difference in flatness profiles further comprising determining the mean field signature associated with a first imprint template used to form the first patterned layer, a second imprint template used to form the second patterned layer, or the first and second imprint templates.

11. The method of claim 8, wherein determining the difference in flatness profiles further comprises removing a flatness induced distortion contribution associated with the first and second substrate chucks.

12. The method of claim 11, wherein the estimated distortion corresponds to the flatness induced distortion contribution.

13. The method of claim 12, wherein determining the difference in flatness profiles further comprises removing a mean field signature, wherein the mean field signature corresponds to repetitive errors that are averaged over all fields.

14. The method of claim 8, further comprising:
forming a formable material over the adaptive layer and the current substrate.

* * * * *